(12) United States Patent
Willetts

(10) Patent No.: US 6,819,720 B1
(45) Date of Patent: Nov. 16, 2004

(54) NOISE CANCELLATION IN A PREDISTORTION ARCHITECTURE

(75) Inventor: Mark N. Willetts, Ottawa (CA)

(73) Assignee: Nortel Networks Limited, St. Laurent (CA)

(*) Notice: Subject to any disclaimer, the term of this patent is extended or adjusted under 35 U.S.C. 154(b) by 340 days.

(21) Appl. No.: 10/184,466

(22) Filed: Jun. 28, 2002

(51) Int. Cl.[7] .............................................. H04B 25/49
(52) U.S. Cl. ...................................... 375/296; 330/149
(58) Field of Search ................................ 375/296, 278, 375/284, 285; 330/149

(56) References Cited

U.S. PATENT DOCUMENTS 6,298,096 B1 * 10/2001 Burgin ........................ 375/296
6,304,140 B1 * 10/2001 Thron et al. ................ 330/149

* cited by examiner

Primary Examiner—Chieh M. Fan
Assistant Examiner—Kevin Kim
(74) Attorney, Agent, or Firm—Withrow & Terranova, PLLC

(57) ABSTRACT

The present invention provides a technique for canceling spurious noise content in transmitted signals. During transmission, the transmitted signals are fed back to circuitry adapted to provide a predistortion component for signals to be transmitted, as well as to compensate for spurious noise injected into the system. In a first path, the circuitry will predistort the baseband signals to provide a predistorted output. Along a second path, a fast Fourier transform is performed on the feedback signal. The resultant frequency domain signal is then processed to detect spurious noise content above an identified defined threshold. The spurious noise content is used to recreate a replica of the noise content. The replica will have the same phase and frequency and a magnitude sufficient to reduce or eliminate the content to a desired degree. The replicated signal is then negatively added to the predistorted signals to create a final signal for transmission.

18 Claims, 3 Drawing Sheets

US 6,819,720 B1

NOISE CANCELLATION IN A PREDISTORTION ARCHITECTURE

FIELD OF THE INVENTION

The present invention relates in general to wireless communications, and in particular to canceling spurious signal content from signals to be transmitted.

BACKGROUND OF THE INVENTION

Wireless communication systems often incorporate predistortion techniques configured to pre-process signals for transmission to compensate for non-linearities or like anomalies inherent to transmission. Unfortunately, the compactness of wireless architectures makes these systems prone to having spurious noise injected into the signals to be transmitted. The source of the spurious noise may take many forms, including the various local oscillators facilitating reception and transmission of wireless communication signals, harmonics and mixing products from mixing circuitry, and the like. Unfortunately, compensating for the unwanted injection of spurious noise content is difficult to address, and can be even more difficult to address in a cost-effective manner in systems incorporating predistortion techniques.

Accordingly, there is a need for a technique to cancel spurious noise in wireless communication systems, and a further need for a technique to cancel spurious noise in wireless communication systems incorporating predistortion techniques to compensate for non-linearities or other anomalies in the transmission path.

SUMMARY OF THE INVENTION

The present invention provides a technique for canceling spurious noise content in transmitted signals. During transmission, the transmitted signals are fed back to predistortion and cancellation circuitry adapted to provide a predistortion component for signals to be transmitted, as well as to compensate for spurious noise injected into the system. In a first path, the predistortion and cancellation circuitry will predistort the baseband signals to compensate for non-linearity and like anomalies injected by the transmission circuitry to provide a predistorted output. Along a second path, a fast Fourier transform is performed on the feedback signal. The resultant frequency domain signal is then processed to detect spurious noise content above a defined threshold, throughout the range or within defined bands. The spurious noise content is identified and used to recreate a replica of the noise content. The replica will preferably have the same phase and frequency, and a magnitude sufficient to reduce or eliminate the content to a desired degree. The replicated signal is then negatively added to the predistorted signals to create a final signal for transmission.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Figure 1:
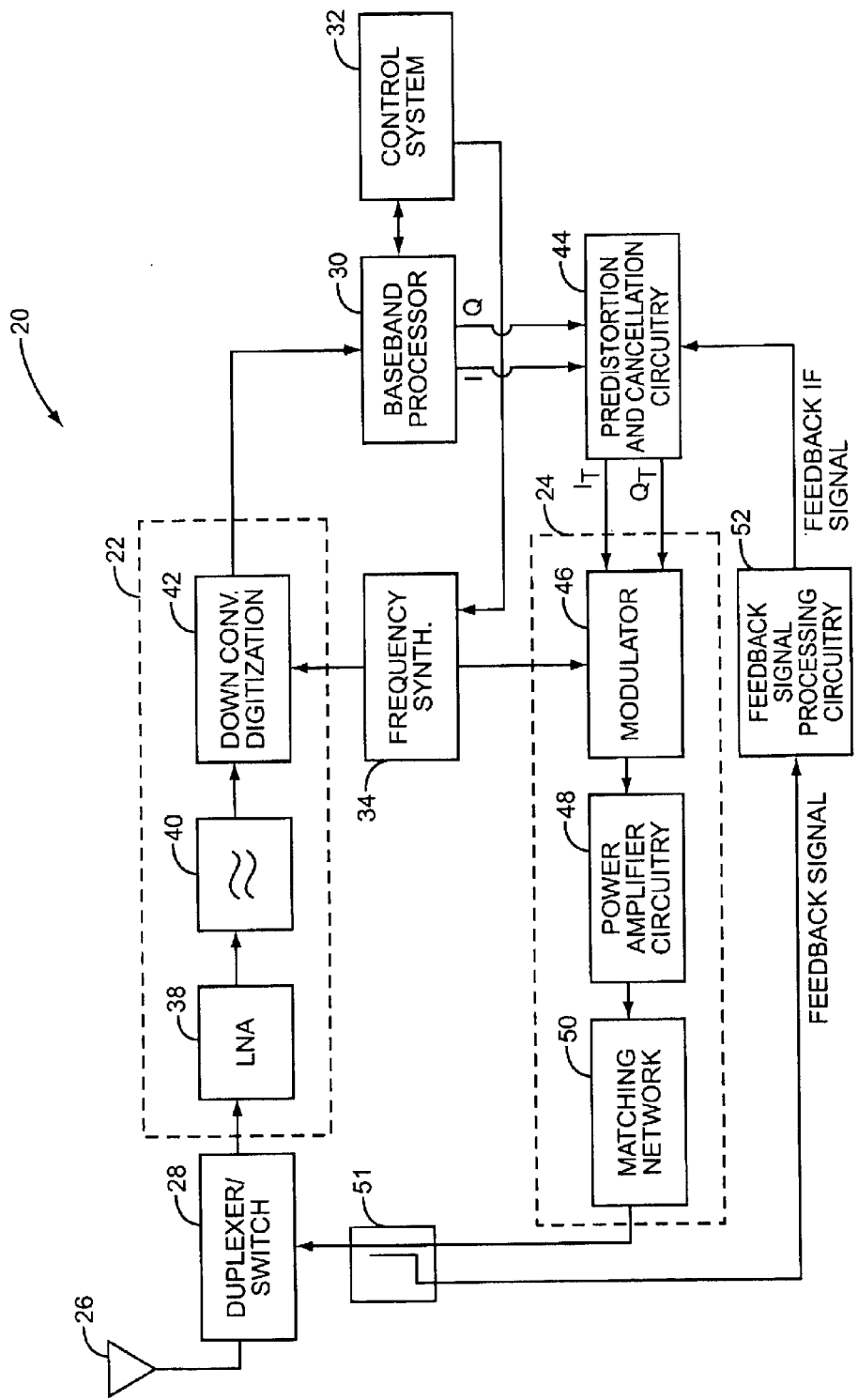
FIG. 1 is a block representation of a base station architecture according to one embodiment of the present invention.

As illustrated in FIG. 1, the present invention may be incorporated in a base station transceiver 20, which includes a receiver front end 22, a radio frequency transmitter section 24, an antenna 26, a duplexer or switch 28, a baseband processor 30, a control system 32, and a frequency synthesizer 34. The receiver front end 22 receives information bearing radio frequency signals from one or more remote transmitters provided by mobile terminals, such as mobile telephones, wireless personal digital assistants, or like wireless communication devices. A low noise amplifier 38 amplifies the signal. A filter circuit 40 minimizes broadband interference in the received signal, while downconversion and digitization circuitry 42 downconverts the filtered, received signal to an intermediate frequency (IF) signal, which is then digitized into one or more digital streams. The receiver front end 22 typically uses one or more mixing frequencies generated by the frequency synthesizer 34.

The baseband processor 30 processes the digitized received signal to extract the information or data bits conveyed in the received signal. This processing typically comprises demodulation, decoding, error correction, and interference cancellation operations. As such, the baseband processor 30 is generally implemented in one or more digital signal processors (DSPs), application specific integrated circuits (ASICs), or field programmable gate arrays (FPGAs). Further detail regarding the operation of the baseband processor 30 is described in greater detail below. On the transmit side, the baseband processor 30 receives digitized data, which may represent voice, data, or control information, from the control system 32, which it encodes for transmission.

The data for transmission is preferably provided in a quadrature format wherein the data is represented by in-phase (I) and quadrature phase (Q) signals. The encoded data is output to predistortion and cancellation circuitry 44, which will be discussed below in greater detail. In general, the predistortion and cancellation circuitry 44 predistorts each of the in-phase and quadrature phase signals I, Q to compensate for non-linearities introduced by the transmission circuitry 24, as well as minimizing the impact of spurious signals on the signals to be transmitted. The resultant in-phase ($I_T$) and quadrature phase ($Q_T$) signals are sent to the transmitter circuitry 24, where they are processed by a modulator 46 to modulate a carrier signal that is at a desired transmit frequency. Power amplifier circuitry 48 amplifies the modulated carrier signal to a level appropriate for transmission, and delivers the modulated carrier signal to the antenna 26 through a matching network 50, coupler 51, and duplexer 28.

For the present invention, the transmitted signal is fed back from the coupler 51 in the form of a feedback signal for processing by feedback signal processing circuitry 52, which will generate a feedback IF signal to send to the predistortion and cancellation circuitry 44. The predistortion and cancellation circuitry 44 facilitates predistortion and cancellation of the spurious signals from the signals to be transmitted based on the feedback IF signal.

Figure 2:
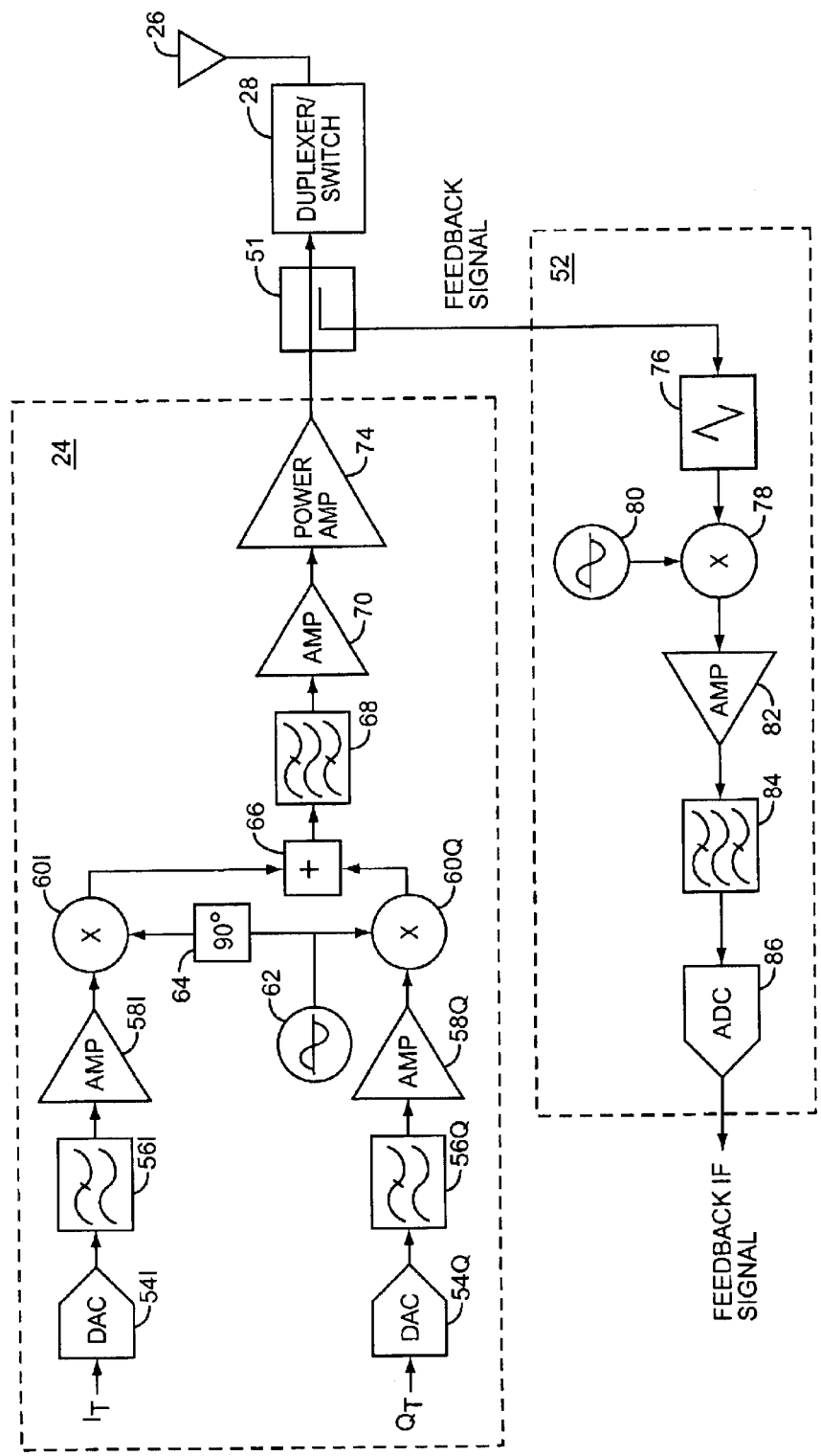
FIG. 2 is a block representation of the feedback circuitry used for predistortion and cancellation according to one embodiment of the present invention.

Turning now to FIG. 2, the in-phase and quadrature phase signals $I_T$ and $Q_T$, which have been predistorted and processed to cancel spurious signals, are respectively presented in a digitized format to digital-to-analog converters (DAC) 54I and 54Q. The DACs 54I, 54Q will convert the respective digitized in-phase and quadrature phase signals $I_T$ and $Q_T$ to an analog format, wherein the respective signals are filtered by filters 56I and 56Q, amplified by amplifiers 58I and 58Q, and presented to mixers 60I and 60Q. The mixers 60I and 60Q are driven in a quadrature arrangement by a radio frequency local oscillator 62 such that the signal provided to mixer 60I is offset by 90 degrees by a 90 degree shift function 64 in traditional fashion. Accordingly, the mixers 60I and 60Q modulate the in-phase and quadrature phase signals $I_T$ and $Q_T$ to generate radio frequency modulated versions of each. The modulated signals are summed at summing circuitry 66, the output of which is filtered by filter 68, preamplified by preamplifier 70, and amplified to a level for transmission by power amplifier 74. The output of the power amplifier 74 is sent to the coupler 51 and then to the duplexer 28 and transmitted via the antenna 26. Preferably, the coupling function is located within the transmit circuitry 24 such that the transmitted signal is fed back in the form of the feedback signal to the feedback signal processing circuitry 52. Alternatively the coupling function could be located within the duplexer 28.

In one embodiment, the feedback signal is sent directly to an attenuator 76 to reduce the level of the feedback signal prior to being presented to mixer 78, which is driven by radio frequency oscillator 80. Thus, the attenuated feedback signal is downconverted to an intermediate frequency (IF) signal by the mixer 78 prior to being amplified by preamplifier 82, filtered by filter 84, and presented to an analog-to-digital converter (ADC) 86 to provide a digitized feedback IF signal, which is presented to the predistortion circuitry 44 to control predistortion and cancellation of spurious signals.

Figure 3:
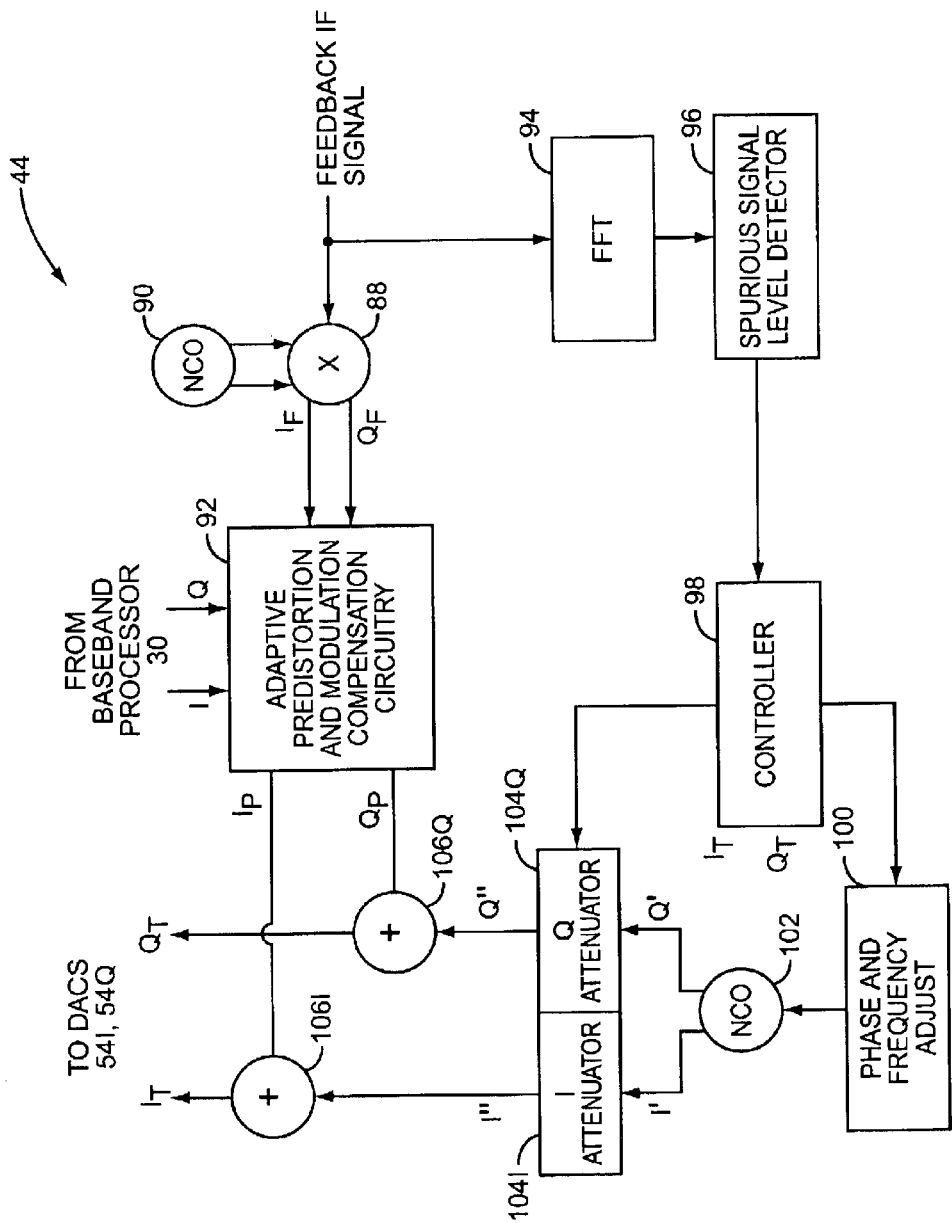
FIG. 3 is a block representation of the predistortion and cancellation circuitry according to one embodiment of the present invention.

Referring now to FIG. 3, the digitized feedback IF signal is split and provided along two separate paths in the predistortion and cancellation circuitry 44. Along the first path, the feedback IF signal is provided to a quadrature-based mixer 88 controlled by a numerically controlled oscillator 90. The quadrature-based mixing circuitry 88 provides in-phase and quadrature phase baseband signals $I_F$ and $Q_F$ derived from the feedback IF signal. The in-phase and quadrature phase baseband signals $I_F$ and $Q_F$ are presented to adaptive predistortion and modulation compensation circuitry 92. This circuitry receives the actual in-phase and quadrature phase data I and Q from the baseband processor 30 and provides the following processing. First, the adaptive predistortion aspect of the circuitry 92 processes the baseband I and Q signals to compensate for non-linearities injected by the transmission circuitry 24. In one embodiment, this is done by multiplying the complex numbers represented by the in-phase and quadrature phase signals I and Q with values from a look-up table that are determined by the in-phase and quadrature phase feedback signals. The modulation compensation aspect of the circuitry 92 adjusts for phase and amplitude imbalance as well as DC offset between the in-phase and quadrature signals incurred in the modulation aspect of transmission circuitry 24. Those skilled in the art will appreciate the various ways to implement predistortion and compensate for I and Q phase and amplitude imbalance as well as DC offset based on the provided feedback. The outputs of the circuitry 92 are the in-phase and quadrature phase signals $I_P$ and $Q_P$, which have been processed to compensate for non-linearities, phase and amplitude imbalances, and DC offsets imposed by the modulation aspect of the transmit circuitry 24.

The second path in the predistortion and cancellation circuitry 44 processes the feedback IF signal to provide in-phase and quadrature phase components configured to cancel spurious signals that are injected into signals being transmitted. These spurious signals might be injected into the system by the transmitter or receiver's local oscillator fundamental or harmonic signals, mixing products of these signals, and the like. Spurious signals injected into the system may also originate from oscillation in amplifiers or from digital circuit clocks, or from harmonics or mixing products of these signals. Since the feedback IF signal is in the time domain, it is first presented to fast Fourier transform (FFT) circuitry 94 to perform a fast Fourier transform or like Fourier transform. The resultant signal is sent to a spurious signal level detector 96. The spurious signal level detector 96 calculates the composite power from the FFT signal or receives it from other circuitry in the base station and also calculates the power in one or more narrow band frequency ranges. The entire spectrum may be divided into multiple narrow bands, or select bands may be defined at or around frequency ranges known to have spurious content. If a spurious signal level within the transmission spectrum exceeds a threshold relative to the composite power, the spurious signal level detector 96 will trigger the controller 98 to attempt to cancel the spurious noise component or otherwise reduce it to an acceptable level. Preferably, the spurious signal level detector 96 will identify the frequency or frequency band, as well as a relative signal level, of spurious content. Accordingly, the controller 98 will signal phase and frequency adjust circuitry 100 to control the numerically controlled oscillator 102 to create in-phase and quadrature phase signals I' and Q' at the appropriate frequency and phase of the spurious content. The in-phase and quadrature phase signals I' and Q' replicating the spurious noise content are respectively sent to in-phase and quadrature phase attenuators 104I and 104Q. For spurious signals detected outside of the transmission bandwidth but within the predistortion and spurious cancellation band, the potential spurious signal will be compared to an absolute level rather than a level relative to the composite power.

In addition to controlling the phase and frequency of the replicated in-phase and quadrature phase signals I' and Q', the controller 98 provides a control signal to the attenuators 104I and 104Q to effectively adjust the magnitude of the replicated in-phase and quadrature phase signals I' and Q' to have the same magnitude as the spurious content. Thus, the output of the attenuators 104I and 104Q are in-phase and quadrature phase signals I" and Q", which have the same frequency, phase, and magnitude as the spurious content. These in-phase and quadrature phase signals I" and Q" are combined or summed with the predistorted in-phase and quadrature phase signals $I_P$ and $Q_P$ at summation circuitry 106I and 106Q to create the in-phase and quadrature phase signals for transmission $I_T$ and $Q_T$, which are provided to the digital-to-analog converters 54I and 54Q (of FIG. 2). Notably, the summation circuitry 106I and 106Q will actually add the negative of the in-phase and quadrature phase signals I" and Q" representing the spurious noise content to effect cancellation of the components in the in-phase and quadrature phase signals for transmission $I_T$ and $Q_T$. Alternatively, the controller 98 will operate to control the numerically controlled oscillator 102 and attenuators 104I and 104Q to create signal replicas, which are 180 degrees out of phase from the spurious content or being the negative thereof. Those skilled in the art will recognize the variations in effectively subtracting the replicas of the spurious content from the predistorted in-phase and quadrature phase signals $I_T$ and $Q_T$. The present invention is particularly beneficial in code division multiple access (CDMA) and wideband CDMA (WCDMA) architectures. Further, the techniques are equally applicable to mobile terminals and wireless LANs in addition to base stations.

Those skilled in the art will recognize improvements and modifications to the preferred embodiments of the present invention. All such improvements and modifications are considered within the scope of the concepts disclosed herein and the claims that follow.

What is claimed is:

1. A method comprising:
    a) downconverting an intermediate frequency (IF) feedback signal derived from signals being transmitted to first quadrature signals;
    b) predistorting baseband quadrature signals based on the first quadrature signals to create predistorted quadrature signals;
    c) performing a Fourier transform on the IF feedback signal to create a frequency domain signal;
    d) detecting a spurious signal exceeding a threshold in the frequency domain signal;
    e) generating cancellation quadrature signals corresponding to a frequency, phase, and amplitude of the spurious signal; and
    f) combining the cancellation quadrature signals and the predistorted quadrature signals to create final quadrature signals for transmission such that an impact of the spurious signal on the signals being transmitted is reduced.

2. The method of claim 1 further comprising:
    a) coupling a radio frequency (RF) feedback signal from the signals being transmitted;
    b) downconverting the RF feedback signal to create an analog IF feedback signal; and
    c) digitizing the analog IF feedback signal to create the IF feedback signal.

3. The method of claim 1 further comprising;
    a) converting the analog quadrature signals to analog to create analog quadrature signals; and
    b) modulating and amplifying the analog quadrature signals to create the signals being transmitted.

4. The method of claim 1 wherein the generating step further comprises:
    a) controlling an oscillator to generate precancellation quadrature signals having corresponding frequency and phase to the spurious signal;
    b) adjusting the magnitude of the precancellation quadrature signals to create the cancellation quadrature signals having a magnitude corresponding to an amount of the spurious signal to cancel.

5. The method of claim 1 wherein each of the various quadrature signals is represented by in-phase and quadrature phase signals.

6. The method of claim 1 further comprising creating the baseband quadrature signals based on data to be transmitted.

7. An apparatus comprising:
    a) downconversion circuitry adapted to downconvert an intermediate frequency (IF) feedback signal derived from signals being transmitted to first quadrature signals;
    b) predistortion circuitry adapted to predistort baseband quadrature signals based on the first quadrature signals to create predistorted quadrature signals;
    c) transform circuitry adapted to perform a Fourier transform on the IF feedback signal to create a frequency domain signal;
    d) spurious signal level detection circuitry adapted to detect a spurious signal exceeding a threshold in the frequency domain signal;
    e) cancellation circuitry adapted to generate cancellation quadrature signals corresponding to a frequency, phase, and amplitude of the spurious signal; and
    f) summation circuitry adapted to combine the cancellation quadrature signals and the predistorted quadrature signals to create final quadrature signals for transmission such that an impact of the spurious signal on the signals being transmitted is reduced.

8. The apparatus of claim 7 further comprising:
    a) a coupler adapted to couple a radio frequency (RF) feedback signal from the signals being transmitted;
    b) second downconversion circuitry adapted to downconvert the RF feedback signal to create an analog IF feedback signal; and
    c) an analog-to-digital converter adapted to digitize the analog IF feedback signal to create the IF feedback signal.

9. The apparatus of claim 7 further comprising;
    a) a digital-to-analog converter adapted to convert the analog quadrature signals to analog to create analog quadrature signals; and
    b) transmission circuitry adapted to modulate and amplify the analog quadrature signals to create the signals being transmitted.

10. The apparatus of claim 7 wherein the cancellation circuitry further comprises:
    a) a oscillator,
    b) in-phase and quadrature phase attenuators;
    c) a controller adapted to:
        i) control the oscillator to generate precancellation quadrature signals having corresponding frequency and phase to the spurious signal; and
        ii) control the in-phase and quadrature phase attenuators to adjust the magnitude of the precancellation quadrature signals to create the cancellation quadrature signals having a magnitude corresponding to an amount of the spurious signal to cancel.

11. The apparatus of claim 7 wherein each of the various quadrature signals is represented by in-phase and quadrature phase signals.

12. The apparatus of claim 7 further comprising a baseband processor for creating the baseband quadrature signals based on data to be transmitted.

13. A system comprising:
    a) means for downconverting an intermediate frequency (IF) feedback signal derived from signals being transmitted to first quadrature signals;

b) means for predistorting baseband quadrature signals based on the first quadrature signals to create predistorted quadrature signals;

c) means for performing a Fourier transform on the IF feedback signal to create a frequency domain signal;

d) means for detecting a spurious signal exceeding a threshold in the frequency domain signal;

e) means for generating cancellation quadrature signals corresponding to a frequency, phase, and amplitude of the spurious signal; and f) means for combining the cancellation quadrature signals and the predistorted quadrature signals to create final quadrature signals for transmission such that an impact of the spurious signal on the signals being transmitted is reduced.

14. The system of claim 13 further comprising:

a) means for coupling a radio frequency (RF) feedback signal from the signals being transmitted;

b) means for downconverting the RF feedback signal to create an analog IF feedback signal; and c) means for digitizing the analog IF feedback signal to create the IF feedback signal.

15. The system of claim 13 further comprising;

a) means for converting the analog quadrature signals to analog to create analog quadrature signals; and b) means for modulating and amplifying the analog quadrature signals to create the signals being transmitted.

16. The system of claim 13 wherein the means for generating further comprises:

a) means for controlling an oscillator to generate precancellation quadrature signals having corresponding frequency and phase to the spurious signal;

b) means for adjusting a magnitude of the precancellation quadrature signals to create the cancellation quadrature signals having a magnitude corresponding to an amount of the spurious signal to cancel.

17. The system of claim 13 wherein each of the various quadrature signals are represented by in-phase and quadrature phase signals.

18. The system of claim 13 further comprising means for creating the baseband quadrature signals based on data to be transmitted.

* * * * *